United States Patent [19]

Nakao

[11] Patent Number: 5,289,518

[45] Date of Patent: Feb. 22, 1994

[54] LOW POWER SHIFT REGISTER CIRCUIT

[75] Inventor: Tomoaki Nakao, Koriyama, Japan

[73] Assignee: Sharp Kabushiki Kaisha, Osaka, Japan

[21] Appl. No.: 831,341

[22] Filed: Feb. 5, 1992

[30] Foreign Application Priority Data

Jul. 25, 1991 [JP] Japan .................................. 3-186585

[51] Int. Cl.$^5$ ...................... H03K 3/284; H03K 19/00
[52] U.S. Cl. ......................................... 377/81; 377/78;
377/106; 307/480; 307/272.2
[58] Field of Search ............ 307/481, 480, 443, 272.2,
307/272.1; 377/73, 78, 81, 68, 116, 106

[56] References Cited

U.S. PATENT DOCUMENTS

| 3,636,376 | 1/1972 | Hoffmann | 377/78 |
| 4,691,122 | 9/1987 | Schnizlein et al. | 307/481 |
| 4,924,484 | 5/1990 | Grasso et al. | 377/106 |
| 5,120,988 | 6/1992 | Matsuki | 377/78 |
| 5,128,974 | 7/1992 | Maekawa | 377/78 |

FOREIGN PATENT DOCUMENTS

| 57-199318 | 12/1982 | Japan . |
| 62-195920 | 8/1987 | Japan . |
| 1114112 | 5/1989 | Japan . |
| 1286609 | 11/1989 | Japan . |

OTHER PUBLICATIONS

Electronic Circuits: Discrete and Integrated, pp 612-615 and pp. 602-605 (1978).
Robert R. Cordell, "A 45-MBIT/S CMOS VLSI Digital Phase Aligner"; Apr., 1988; IEEE Journal of Solid-State Circuits; pp. 323-328.

Primary Examiner—Edward P. Westin
Assistant Examiner—Richard Roseen

[57] ABSTRACT

A logic circuit for outputting signals corresponding to an input signal depending on a clock signal sent from an external source includes at least one synchronous flip-flop being synchronized with the clock signal, so that the flip-flop latches the input signal, and a unit for controlling an input of the clock signal to the flip-flop based on a difference between logic levels of an output signal of the flip-flop and an input signal newly latched by the flip-flop.

8 Claims, 3 Drawing Sheets

LOW POWER SHIFT REGISTER CIRCUIT

BACKGROUND OF THE INVENTION

1. Field of the Invention

The present invention relates to a logic circuit which includes at least one synchronous flip-flop.

2. Description of the Related Art

A four-bit shift register is known as one example of a CMOS (Complementary Metal-Oxide Semiconductor) logic circuit including synchronous flip-flops which are synchronized with clock signals. This four-bit shift register is arranged to have four synchronous D-type flip-flops F1, F2, F3 and F4. The flip-flops F1, F2, F3 and F4 are sequentially connected to each other. That is, the flip-flop F1 is serially connected to the flip-flop F2. The flip-flop F2 is connected serially to the flip-flop F3. The flip-flop F3 is serially connected to the flip-flop F4. Each of the four synchronous D-type flip-flops is connected to an inverter. The inverters supply a clock signal to each flip-flop. In an initial state that each of the flip-flops outputs a low-level signal, when a data signal which is input to the flip-flop F1 rises to a high level, at first, the flip-flop F1 latches the high-level data signal at the leading edge of the clock signal and outputs a high-level output signal H1. The flip-flop F2 latches the high-level signal H1 sent by the flip-flop F1 at the next leading edge of the clock signal and outputs a high-level output signal H2. Likewise, the remaining flip-flops F3 and F4 serve to output their high-level output signals H3 and H4 in the same process as above.

Conversely, when the data signal lowers to a low level, those flip-flops F1 to F4 serve to sequentially output the low-level signals L1 to L4 as being synchronized with the clock signals. That is to say, the data signal input to the flip-flop F1 is shifted to the next flip-flops as being synchronized with each leading edge of the clock signals so that the flip-flops F1 to F4 serve to output parallel signals in sequence.

The aforementioned shift register is arranged to inevitably receive a clock signal even when the data signal input to each flip-flop has the same logic level as the output signal of each flip-flop, therefore, in the case that no flip-flops are required to change their states. The clock signals input to the flip-flops result in charge and discharge currents flowing in internal circuits of the flip-flops, which thereby consumes power. As such, the logic circuit is arranged so that a clock signal is input to the flip-flops of the logic circuit if not necessary, which results in the idle current flowing in the logic circuit.

The shift register needs an inverter arranged to have a CMOS transistor of a large driving capacity, for supplying clock signals to the flip-flops F1 to F4 of the shift register. Such a CMOS transistor having a large driving capacity entails flow of a large through current in internal circuits of the flip-flops when the clock signal is reversed. It is another disadvantageous factor of increasing the idle current, that is, of increasing the power consumption.

SUMMARY OF THE INVENTION

It is therefore an object of the present invention to provide a logic circuit which is capable of lowering the power consumption by means of reducing an idle current flowing through the logic circuit.

The object of the invention can be achieved by a logic circuit for outputting signals corresponding to an input signal depending on a clock signal sent from an external, including:

at least one synchronous flip-flop being synchronized with the clock signal, the flip-flop for latching the input signal; and a unit for controlling an input of the clock signal to the flip-flop based on a difference between logic levels of an output signal of the flip-flop and an input signal newly latched by the flip-flop.

In operation, the controlling unit operates to control the clock signal being input from the external to the flip-flops based on the difference between the logic levels of the output signal of the flip-flop and the input signal newly latched by the flip-flop. Preferably, when those logic levels are equal to each other, that is, in case that no flip-flops are required to change their states, the clock signal is prevented from being input to the flip-flops. It results in being able to reduce an idle current flown through the internal circuit of the flip-flop, and to lower the power consumption. Further, the controlling unit serves to supply the clock signal to each flip-flop. Hence, no inverter having a large driving capacity is required, resulting in reducing a through current flown through the inverter when the clock signal is reversed.

Further objects and advantages of the present invention will be apparent from the following description of the preferred embodiments of the invention as illustrated in the accompanying drawings.

DESCRIPTION OF THE PREFERRED EMBODIMENTS

In order to give a help of understanding the present invention, before describing the embodiments, a general operation of a digital circuit will be described.

Figure 1:
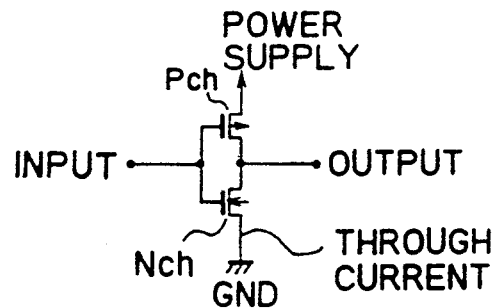
FIG. 1 is a circuit diagram showing a typical inverter composed of a digital circuit of CMOS arrangement.
Figure 2:
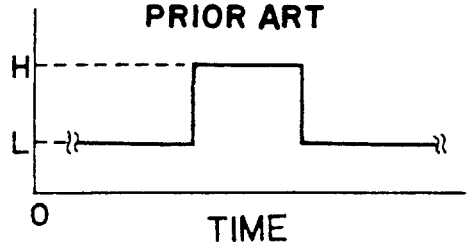
FIG. 2 is a timing chart showing an input signal.

FIG. 1 shows a circuit diagram illustrating a typical inverter composed of a digital circuit of a CMOS arrangement, and FIG. 2 shows a timing chart of an example of an input signal.

The current consumed in the digital circuit of a CMOS arrangement is, in large, divided into a through current and a charge and discharge current. In the inverter as shown in FIG. 1, for example, the through current means a current flowing between a power supply and a grounding terminal GND when the two MOS transistors Pch and Nch are switched on at the same time for quite a short time as a result of reversing the input signal ("L (low)" to "H (high)" or "H" to "L") as shown in FIG. 2.

The charge and discharge current means a current flowing when a parasitic capacitance is charged or discharged between a gate electrode of the MOS transistor and the other electrode. It is also generated depending on the change of the electric potential of the input signal.

Figure 3:
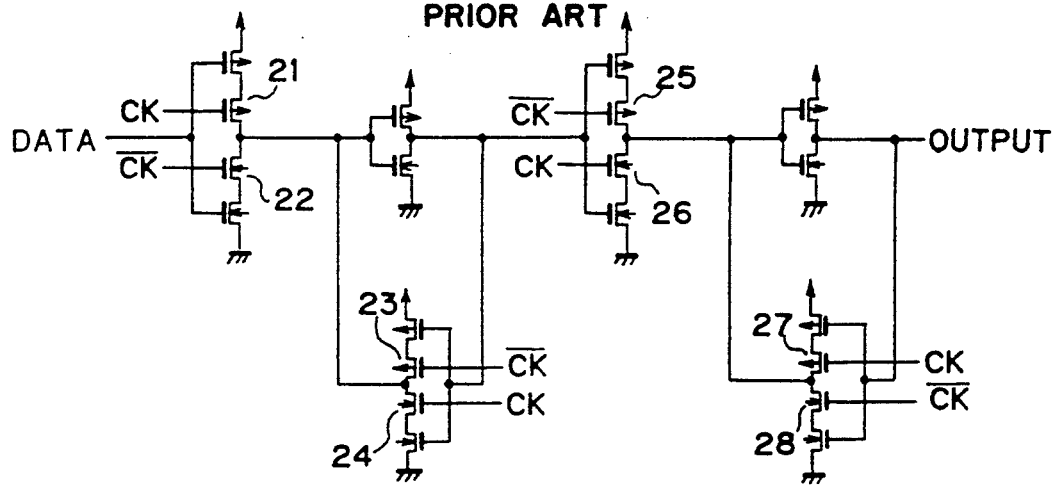
FIG. 3 is a circuit diagram showing a typical flip-flop circuit of CMOS arrangement.
Figure 3:
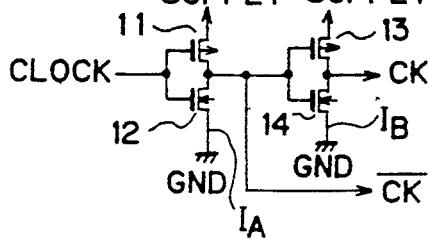

FIG. 3 shows an example of a flip-flop circuit of a CMOS arrangement.

As shown in FIG. 3, in this circuit, when an input clock signal CLOCK is reversed as shown in FIG. 2 and the two MOS transistors 11 and 12 are switched on at the same time for quite a short time, a through current IA which flows between a power supply and a grounding terminal GND is generated. Also, when the two MOS transistors 13 and 14 are switched on at the same time for quite a short time, a through current IB which flows between a power supply and a grounding terminal GND is generated. Even if an input data signal DATA does not change, since the signal CLOCK is reversed, charge and discharge currents flow for charging or discharging the parasitic capacitance of each of MOS transistors 21 to 28.

In this arrangement, even if the input data signal DATA does not change or it is not necessary to apply the signal CLOCK to the flip-flop, when the signal CLOCK is reversed, the through current or the charge and discharge current flows as a result, thereby consumes large currents.

The embodiments of the present invention are arranged to remove unnecessary reversing of the signal CLOCK, and the through current and the charge and discharge current are suppressed to a minimum as a result.

An embodiment of the present invention will be described in detail with reference to FIGS. 4 and 5.

Figure 4:
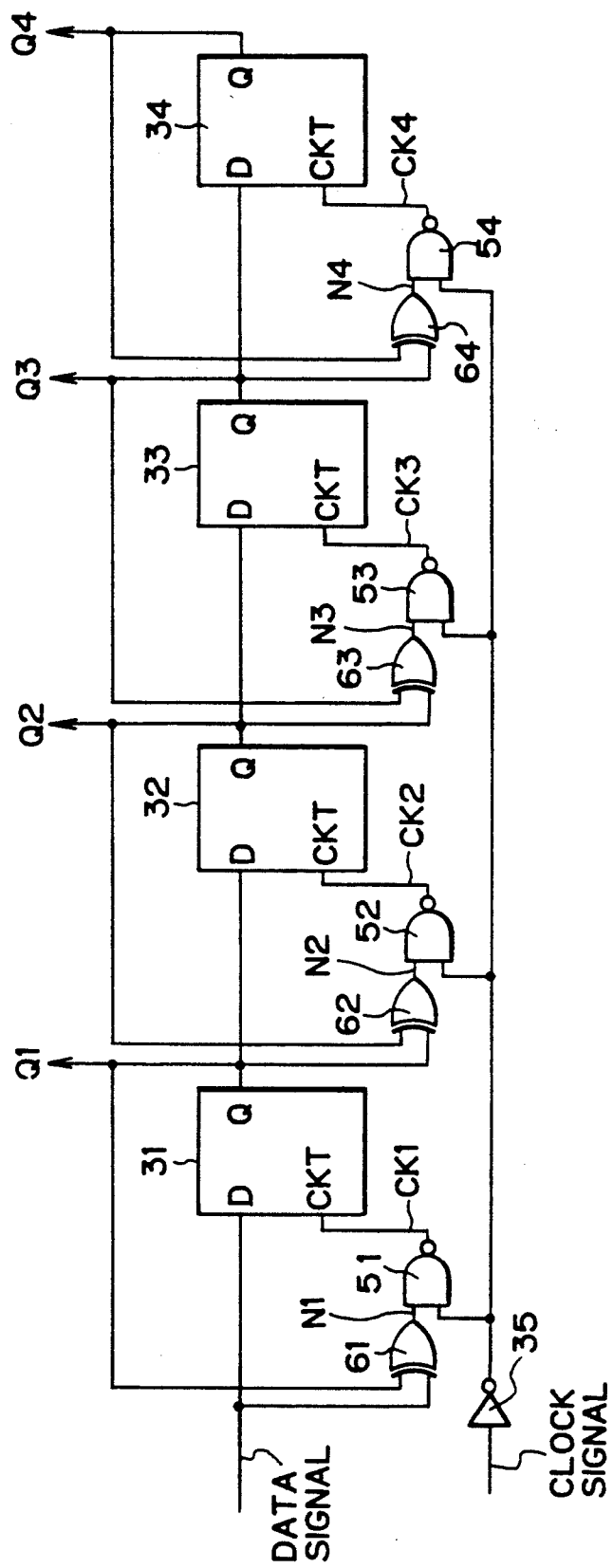
FIG. 4 is a circuit diagram showing a shift register according to an embodiment of the present invention.

FIG. 4 shows a four-bit shift register of a CMOS arrangement according to an embodiment of the invention.

This shift register is configured to have four synchronous flip-flops 31, 32, 33, 34 which are synchronized with clock signals, NAND gates 51, 52, 53, 54 and exclusive OR gates 61, 62, 63, 64. Each flip flop provides a combination circuit including one exclusive OR gate and one NAND circuit.

The two inputs of the exclusive OR gate 61 are respectively connected to a data signal terminal and an output terminal. The output of the exclusive OR gate 61 is connected to one of the input terminals of the NAND gate 51. The other input terminal of the NAND gate 51 is connected to an output terminal of an inverter 35 for supplying a clock signal. The output terminal of the NAND gate 51 is connected to a clock-signal input terminal CKT of the flip-flop 31.

The other combination circuits employ the same arrangement. That is to say, each one input of the exclusive OR gates 62, 63, 64 is connected to each data-signal input terminal D of the flip-flops 32, 33, 34. Each of the other inputs of the exclusive OR gates 62, 63, 64 is connected to each of the output terminals Q of the flip-flops 32, 33, 34. Each of the outputs of the exclusive OR gates 62, 63, 64 is connected to each one input of the NAND gates 52, 53, 54. Each of the other inputs of the NAND gates 52, 53, 54 is connected together to the output of the inverter 35. The outputs of the NAND gates 52, 53, 54 are respectively connected to the clock-signal input terminals CKT of the flip-flops 32, 33, 34.

Figure 5:
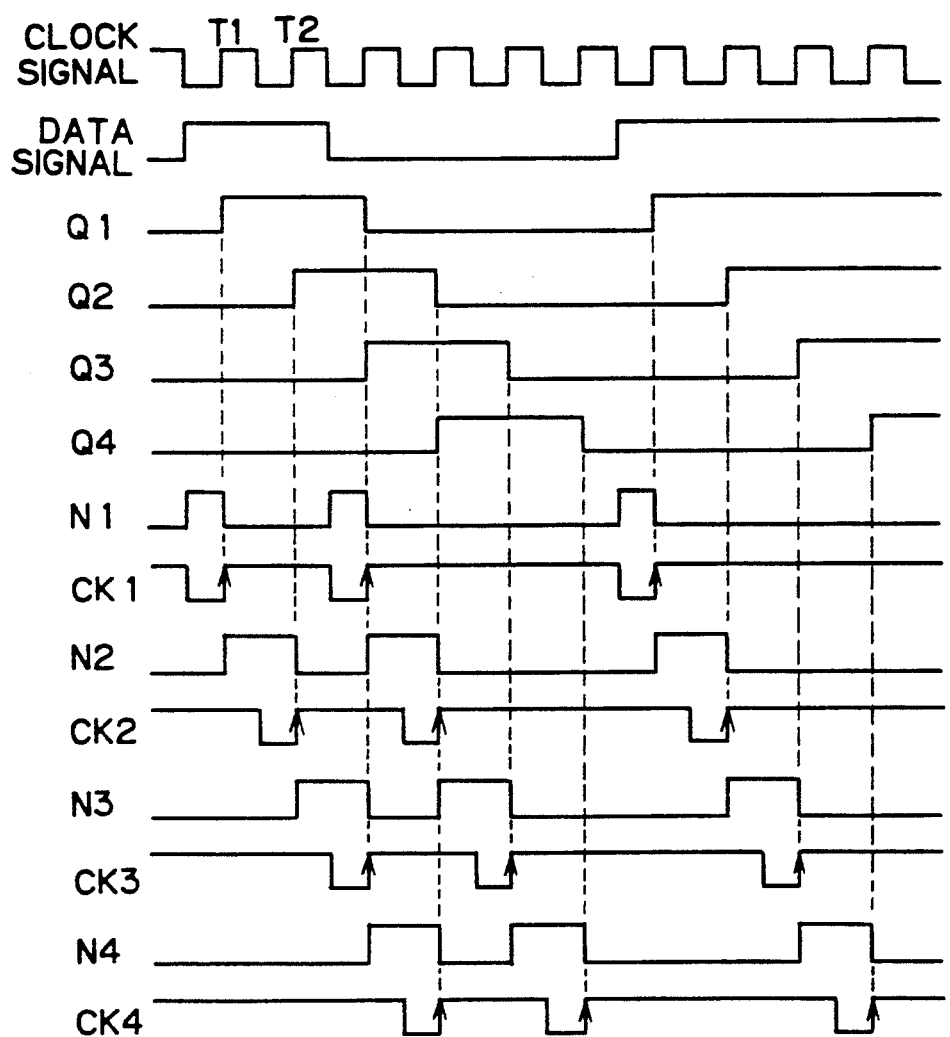
FIG. 5 is a timing chart showing operation of the shift register shown in FIG. 4.

In turn, the description will be directed to the operation of the logic circuit with reference to a timing chart of FIG. 5.

As shown in FIG. 5, in the timing chart, it is assumed that the output signals Q1, Q2, Q3, Q4 of the flip-flops 31, 32, 33, 34 stay at a low level. When a high-level data signal is input to the flip-flop 31, the exclusive OR gate 61 serves to supply a high-level output signal N1 to the NAND gate 51, because the two signals input to the exclusive OR gate 61 stay at different logic levels.

Hence, the clock signal, which has been reversed by the inverter 35 is, again, reversed as a clock signal CK1 by the NAND gate 51 and then is input to the flip-flop 31. As a result, the flip-flop 31 latches the high-level data signal as being synchronized with a timing T1 corresponding to the first leading edge of the clock signal and then outputs the high-level output signal Q1.

At the next timing T2 of the clock signal, the high-level data signal continues to be input to the flip-flop 31. In this case, since the output signal Q1 is at a high level, the exclusive OR gate 61 outputs a low-level output signal N1. Hence, the clock signal is blocked by the NAND gate 51, so that the clock signal is not supplied to the flip-flop 31. That is, in the case that the output signal Q1 is at the same logic level as the new input data signal, the clock signal is blocked by the NAND gate 51, so that the clock signal is not allowed to be supplied to the flip-flop 31. Hence, the flow of an idle charge and discharge current through an internal circuit of the flip-flop 31 is prevented as a result.

The flip-flops 32 to 34 operate in the same manner. That is, each of the flip-flops 32 to 34 receives a data signal at the data-signal input terminal D and outputs the corresponding signal of Q2 to Q4 having the same logic level as the input data signal. However, in case that the newly input data signal has the same logic level as the output signal of the flip-flop, the exclusive OR gates 62, 63, 64 serve to respectively output the corresponding low-level output signals N2, N3, N4. Hence, the clock signal is blocked by the NAND gates 52, 53, 54. As a result, the flow of an idle charge and discharge current through the internal circuit of each flip-flop is prevented.

The shaft register has another advantage of reducing the current consumption. In this shift register, clock signals CK1 to CK4 are respectively supplied from the NAND gates 51, 52, 53, 54 to the flip-flops 31 to 34. Unlike the typical shift register described above, no inverter is required for supplying clock signals to a lot of flip-flops. As a result, the through current in the CMOS transistor composing the inverter is eliminated when the clock signal is reversed.

The foregoing embodiment has been described with respect to the logic circuit including four synchronous flip-flops, four NAND gates and four exclusive OR gates, however, the number of the flip-flops; the NAND gates and the exclusive OR gates is not limited by four. As the number of the flip-flops, the NAND gates and the exclusive OR gates, one, two, three or N, which is a number larger than four, can be taken.

Many widely different embodiments of the present invention may be constructed without departing from the spirit and scope of the present invention. It should be understood that the present invention is not limited to the specific embodiments described in the specification, except as defined in the appended claims.

What is claimed is:

1. A low power shift register circuit for outputting signals corresponding to an input signal according to a clock signal supplied thereto, comprising:

a plurality of flip-flops connected in cascade, each of said flip-flops having a data input terminal for receiving a data signal, said input signal being supplied to a data input terminal of one of said flip-flops at a first stage and data input terminals of the other of said flip-flops receiving output signals from a previous one of said flip-flops respectively, each of said flip-flops latching data on the data input terminal in synchronous with the clock signal supplied thereto; and a plurality of clock controlling means, each of said clock controlling means connected to receive said clock signal for controlling an input of said clock signal to respective ones of said flip-flops based on a difference between logic levels of the output signals of said respective ones of said flip-flops and said data signal applied to the data input terminal of said respective ones of said flip-flops so as to prevent the clock signal from being input in a case that the applied data is equal to the level of the output signals and save power consumption, each of said clock controlling means includes first gate means connected to receive said clock signal for selectively passing said clock signal, so that said clock signal is supplied to said respective ones of said flip-flops through said first gate means without an inverter being required for supplying the clock signal to said flip-flops.

2. A low power shift register circuit according to claim 1 wherein each of said controlling means includes second gate means connected to receive the output signals of said respective ones of said flip-flops and data applied to the data input terminal of said respective ones of said flip-flops for generating a control signal to open said first gate means when the data applied to said data input terminal is different from the levels of the output signals.

3. A low power shift register circuit according to claim 2, wherein said first gate means includes a NAND gate having two inputs and one output, and said second gate means includes an exclusive OR gate having two inputs and one output.

4. A low power shift register circuit according to claim 3, wherein said two inputs of said exclusive OR gate are respectively connected to receive data applied to said respective one of said flip-flops and the output signal of said respective one of said flip-flops, said two inputs of said NAND gate are respectively connected to receive said output of said exclusive OR gate and said clock signal, and said output of said NAND gate is connected to a clock input terminal of said respective one of said flip-flops.

5. A low power shift register circuit receiving an input signal and a clock signal for outputting an output signal synchronized with said clock signal, comprising:

a plurality of flip-flops connected in cascade, each having
a data input terminal,
a data output terminal for providing said output signal, and
a controlled clock signal terminal for receiving a controlled clock signal, the data input terminal of a first stage of said flip-flops receives said input signal, the data input terminal of the other of said flip-flops is connected to the data output terminal of the previous one of said flip-flops; and a plurality of clock controlling means corresponding to said flip-flops for supplying said controlled clock signals to said controlled clock signal terminals respectively, each of said clock controlling means having two input terminals respectively connected to the data output terminals of the corresponding one of said flip-flops, a clock receiving terminal receiving said clock signal, an output terminal connected to the controlled clock signal terminal of said one of said flip-flops for outputting the controlled clock signal when a logic level of said data input terminal of said one of said flip-flops is different from a logic level of said data output terminal of said one of said flip-flops.

6. A low power shift register circuit according to claim 5, wherein each of said clock controlling means further includes, first gate means having two input terminals acting as the two input terminals of said clock controlling means and an output terminal being connected to one of two input terminals of second gate means, and said second gate means, having another of the two input terminals acting as the clock receiving terminal of said clock controlling means and an output terminal acting as the output terminal of said clock controlling means.

7. A low power shift register circuit according to claim 6, wherein said first gate means includes an exclusive OR gate, and said second means includes a NAND gate.

8. A low power shift register circuit according to claim 6, wherein the shift register circuit outputs a plurality of parallel output signals synchronized with said clock signal.

* * * * *